(12) United States Patent
Jo et al.

(10) Patent No.: US 9,647,005 B2
(45) Date of Patent: May 9, 2017

(54) DISPLAY DEVICE AND MANUFACTURING METHOD THEREOF

(71) Applicant: Samsung Display Co., Ltd., Yongin-si (KR)

(72) Inventors: Kang Moon Jo, Seoul (KR);
Kyung-Hoon Kim, Uiwang-si (KR);
Dong Woo Kim, Seongnam-si (KR); Il Gon Kim, Seoul (KR); Se Hyoung Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/958,011

(22) Filed: Dec. 3, 2015

(65) Prior Publication Data
US 2016/0218116 A1 Jul. 28, 2016

(30) Foreign Application Priority Data
Jan. 28, 2015 (KR) .................. 10-2015-0013774

(51) Int. Cl.
*H01L 27/12* (2006.01)
*H01L 21/56* (2006.01)
*H01L 23/29* (2006.01)
*H01L 23/31* (2006.01)

(52) U.S. Cl.
CPC .......... *H01L 27/124* (2013.01); *H01L 21/563* (2013.01); *H01L 23/293* (2013.01); *H01L 23/3171* (2013.01); *H01L 27/1248* (2013.01); *H01L 2924/0002* (2013.01)

(58) Field of Classification Search
CPC ............... H01L 27/124; H01L 27/1214; H01L 27/3244; H01L 27/3262; H01L 29/24; H01L 29/66969; H01L 21/563; H01L 21/76802; H01L 21/441; H01L 23/293;
(Continued)

(56) References Cited

U.S. PATENT DOCUMENTS 5,994,155 A * 11/1999 Kim .................... H01L 27/1214
257/E27.111
8,164,152 B2 4/2012 Lee et al.
2011/0193076 A1 8/2011 Yun et al.
(Continued)

FOREIGN PATENT DOCUMENTS

KR 10-2004-0045113 6/2004
KR 10-1254241 4/2013

*Primary Examiner* — Tucker J Wright
(74) *Attorney, Agent, or Firm* — H.C. Park & Associates, PLC

(57) ABSTRACT

A display device includes: a gate electrode, a gate line, and data lines on a substrate, the data lines in a same layer as the gate line; a gate insulating layer on the gate line; a semiconductor member on the gate insulating layer; an etch stopper layer on the semiconductor member and the gate insulating layer; a first passivation layer on the etch stopper layer; a source electrode on the first passivation layer and the etch stopper layer and connected to the data lines; a drain electrode on the etch stopper layer; a common electrode on the first passivation layer and separated from the source electrode and the drain electrode; a second passivation layer on the source electrode, the drain electrode and the common electrode; and a pixel electrode on the second passivation layer and connected to the drain electrode.

3 Claims, 4 Drawing Sheets

(58) Field of Classification Search
CPC ........... H01L 23/3171; H01L 21/76829; H01L 27/1259
See application file for complete search history.

(56) References Cited

U.S. PATENT DOCUMENTS

2014/0104527 A1* 4/2014 Yang .................. H01L 27/1225
349/43
2015/0155309 A1 6/2015 Li et al.
2015/0162354 A1 6/2015 Jo et al.

* cited by examiner

DISPLAY DEVICE AND MANUFACTURING METHOD THEREOF

CROSS REFERENCE TO RELATED APPLICATION

This application claims priority from and the benefit of Korean Patent Application No. 10-2015-0013774, filed on Jan. 28, 2015, which is hereby incorporated by reference for all purposes as if fully set forth herein.

BACKGROUND

Field

Exemplary embodiments relate to a display device and a manufacturing method thereof.

Discussion of the Background

A liquid crystal display, which is a type of widely-used flat panel display, typically includes a pair of display panels with field-generating electrodes, such as pixel electrodes, a common electrode, and a liquid crystal layer disposed between the display panels. The liquid crystal display may apply electric voltages to the electrodes to generate an electric field in the liquid crystal layer, and the electric field may determine orientations of liquid crystal molecules in the liquid crystal layer. The liquid crystal display may change the electric voltage to control the polarization of incident light moving through the liquid crystal layer to display images.

The pixel electrodes and the common electrode may be provided in different panels or in the same panel. The display panels may include gate lines transmitting gate signals, and data lines transmitting data signals crossing the gate lines. The display panels may further include thin film transistors connected to the gate lines and the data lines, light blocking members, and color filters.

It is difficult to manufacture a display panel including both the pixel electrodes and the common electrode.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display panel including both the pixel electrodes and the common electrode Additional aspects will be set forth in the detailed description which follows, and, in part, will be apparent from the disclosure, or may be learned by practice of the inventive concept.

An exemplary embodiment discloses a display device, including: a substrate; a gate electrode and a gate line disposed on the substrate; a plurality of data lines disposed on the substrate, disposed on a same layer as the gate line, and separated from the gate line; a gate insulating layer disposed on the gate line, the gate electrode, and the plurality of data lines; a semiconductor member disposed on the gate insulating layer; an etch stopper layer disposed on the semiconductor member and the gate insulating layer; a first passivation layer disposed on the etch stopper layer; a source electrode disposed on the first passivation layer and the etch stopper layer and connected to the plurality of data lines; a drain electrode disposed on the etch stopper layer and separated from the source electrode; a common electrode disposed on the first passivation layer and separated from the source electrode and the drain electrode; a second passivation layer disposed on the source electrode, the drain electrode and the common electrode; and a pixel electrode disposed on the second passivation layer and connected to the drain electrode.

An exemplary embodiment also discloses a method of manufacturing a display device, including: forming a gate electrode, a gate line, and a data line on a substrate; forming a gate insulating layer the gate electrode, the gate line, and the data line; forming a semiconductor member on the gate insulating layer; depositing an etch stopper layer and a first passivation layer on the gate insulating layer and the semiconductor member; etching the first passivation layer, the etch stopper layer and the gate insulating layer to contact holes exposing the data line and the semiconductor member; forming a source electrode connected to the data line, a drain electrode separated from the source electrode, and a common electrode separated from the source electrode and the drain electrode on the first passivation layer and the etch stopper layer; forming a second passivation layer on the source electrode, the drain electrode and the common electrode; and forming a pixel electrode on the second passivation layer, the pixel electrode connected to the drain electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
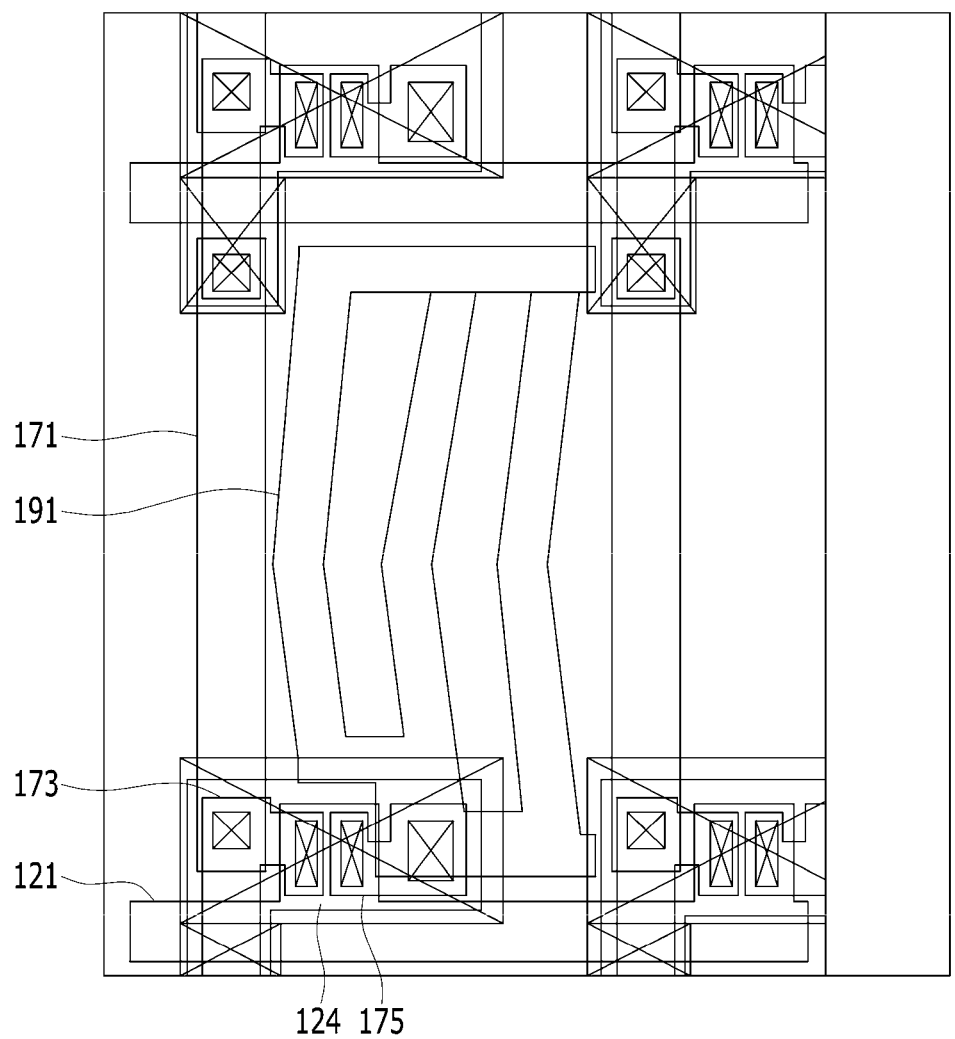
FIG. 1 is a layout view of a display device according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

A display device according to an exemplary embodiment is described in detail with reference to with reference to FIG. 1 and FIG. 2.

Figure 2:
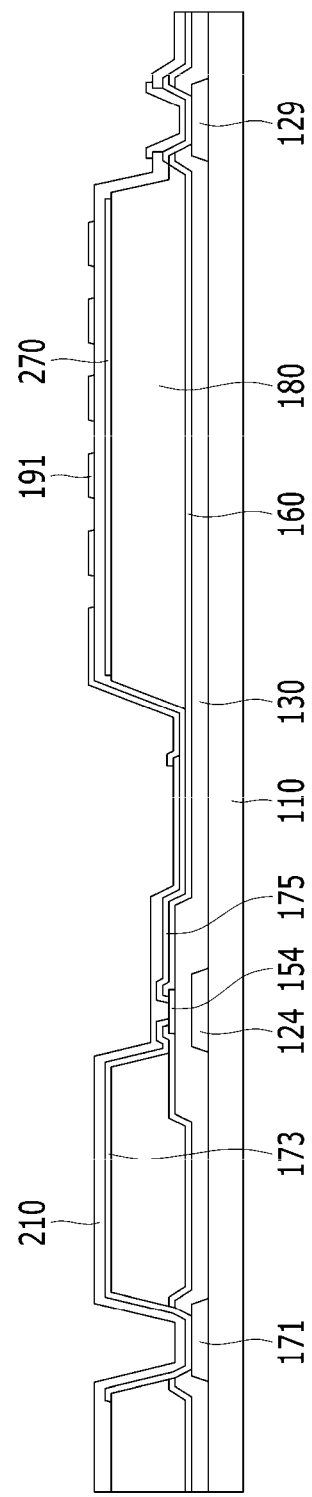
FIG. 2 is a schematic sectional view of the display device shown in FIG. 1.

FIG. 1 is a layout view of a display device according to an exemplary embodiment, and FIG. 2 is a schematic sectional view of the display device shown in FIG. 1.

Referring to FIG. 1 and FIG. 2, a plurality of gate lines 121, a plurality of gate electrodes 124 branching from the gate lines 121, a plurality of data lines 171, and a pad portion 129 are disposed on an insulating substrate 110. The insulating substrate 110 may include at least one of transparent glass, plastics, etc.

The gate lines 121 may transmit gate signals and may extend in a substantially transverse direction. The data lines 171 may include a plurality of longitudinal members disposed between the gate lines 121, may extend in a longitudinal direction, and may be electrically and/or physically separated from each other. The pad portion 129 may include gate pads connected to the gate lines 121 and data pads connected to the data lines 171.

A gate insulating layer 130 is disposed on the gate lines 121, the gate electrodes 124, and the data lines 171. The gate insulating layer 130 may include inorganic or organic insulators. The gate insulating layer 130 may include a single layer or multiple sublayers.

A plurality of semiconductor members 154 is disposed on the gate insulating layer 130. The semiconductor members 154 may include oxide semiconductors including, for example, at least one of indium (In), gallium (Ga), zinc (Zn), and tin (Sn).

A plurality of ohmic contact members (not shown) may be disposed on the semiconductor members 154. The ohmic contact members may include silicides; for example, n+ hydrated amorphous silicon heavily doped with n-type impurities.

An etch stopper layer 160 and a first passivation layer 180 are sequentially disposed on the semiconductor members 154 and the gate insulating layer 130. The first passivation layer 180 may include an inorganic material and may be thicker than etch stopper layer 160.

A plurality of source electrodes 173, a plurality of drain electrodes 175, and a common electrode 270 are disposed on the first passivation layer 180. The source electrodes 173 and the drain electrodes 175 are connected to the semiconductor members 154 through contact holes formed in the etch stopper layer 160 and the first passivation layer 180. The source electrodes 173 are also connected to the data lines 171 through contact holes formed in the gate insulating layer 130, the etch stopper layer 160, and the first passivation layer 180. The source electrodes 173 connect the longitudinal members separated by the gate lines 121.

A gate electrode 124, a source electrode 173, and a drain electrode 175 along with a semiconductor member 154 may form a thin film transistor (TFT). The TFT may be a switch that transmits data voltages from a data line 171. A channel of the TFT is disposed in a portion of the semiconductor member 154 between the source electrodes 173 and the drain electrodes 175.

Figure 4:
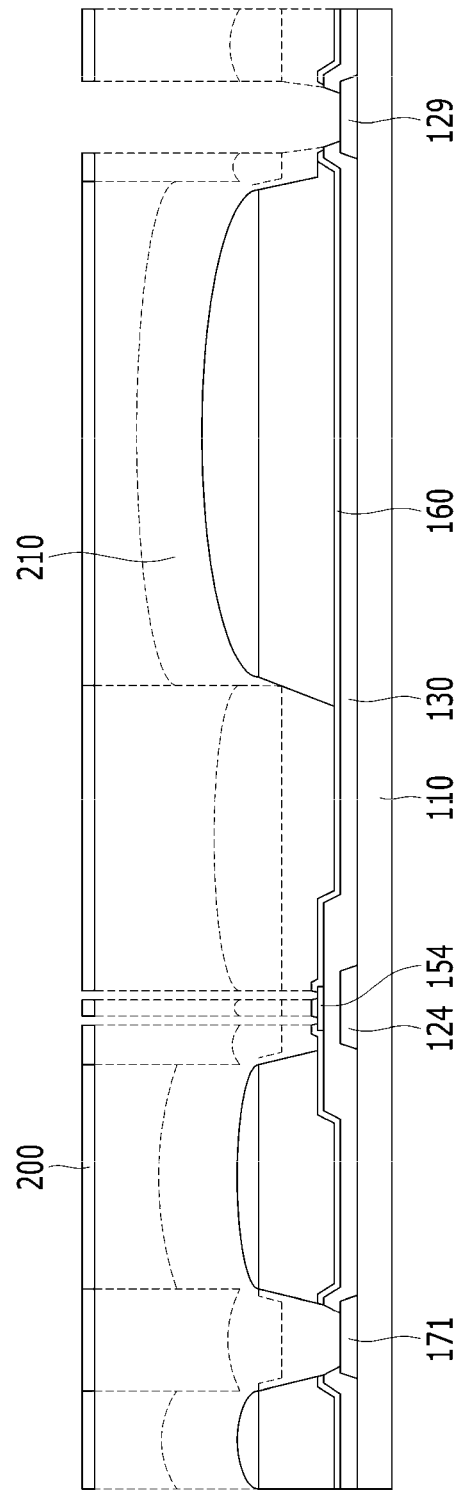

A second passivation layer 210 (as shown in FIG. 4) may be disposed on the source electrodes 173, the drain electrodes 175, and the common electrode 270. The second passivation layer 210 may include an organic insulator or an inorganic insulator, and may have a single-layered or multiple-layered structure.

A plurality of pixel electrodes 191 is disposed on the second passivation layer 210. The pixel electrodes 191 are connected to the drain electrodes 175 through contact holes formed in the second passivation layer 210.

A manufacturing method of a display device according to an exemplary embodiment is described in detail with reference to with reference to FIG. 3 and FIG. 4, as well as FIG. 1 and FIG. 2.

Figure 3:
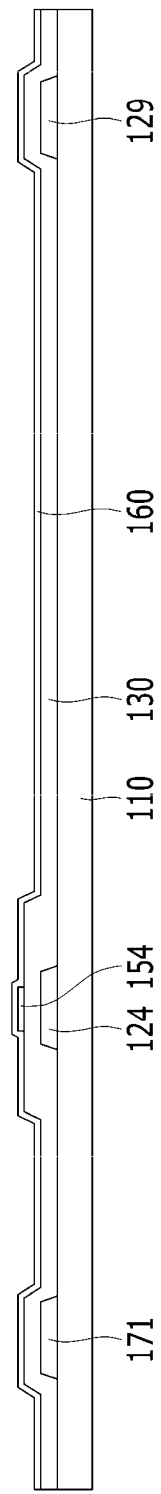
FIG. 3 and FIG. 4 are sectional views showing a manufacturing method of the display device shown in FIG. 1 and FIG. 2.

FIG. 3 and FIG. 4 are sectional views of showing a manufacturing method of the display device shown in FIG. 1 and FIG. 2.

Referring to FIG. 3, first, a plurality of gate lines 121 (shown in FIG. 1), a plurality of gate electrodes 124 branching from the gate lines 121, a plurality of data lines 171, and a pad portion 129 are formed on an insulating substrate 110. The insulating substrate 110 may include transparent glass and/or plastics.

Subsequently, a gate insulating layer 130, which may include organic insulation material, such as silicon nitrides ($SiN_x$) or silicon oxides ($SiO_x$), may be formed on the gate lines 121, the gate electrodes 124, and the data lines 171. The gate insulating layer 130 may have a single-layered or multiple-layered structure.

Next, a semiconductor material such as a metal oxide may be deposited on the gate insulating layer 130, and may be patterned to form a plurality of semiconductor members 154. The semiconductor members 154 may be disposed on the gate electrodes 124.

Thereafter, referring to FIG. 3 and FIG. 4, an etch stopper layer 160 and a first passivation layer 180 may be deposited in sequence, and a photoresist layer 200 may be coated thereon. The photoresist layer 200 may be then exposed to light through a mask having position-dependent light transmittance, and developed. The gate insulating layer 130, the etch stopper layer 160, and the first passivation layer 180 may be etched to form contact holes on the data lines 171 and the semiconductor members 154. Other contact holes disposed on a pad portion 129 including gate pads and data pads may be also formed at this time.

Referring back to FIG. 2, a plurality of source electrodes 173, a plurality of drain electrodes 175, and a common electrode 270 may be formed, and a second passivation layer 210 is deposited and patterned to form contact holes on the pad portion 129. Thereafter, a plurality of pixel electrodes 191 is formed.

According to an exemplary embodiment, conductive members formed of a layer forming the source electrodes 173, and/or conductive members formed of a layer forming the pixel electrodes 191 are disposed on the contact holes on the pad portion 129 to be connected to the pad portion 129.

In accordance with exemplary embodiments, gate lines and main parts of the data lines may be formed by a single process. Additionally, the source electrode, drain electrode, and common electrode may be formed by another single process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    a substrate;
    a gate electrode and a gate line disposed on the substrate;
    data lines disposed on the substrate in a same layer as the gate line, and electrically separated from the gate line;
    a gate insulating layer disposed on the gate line, the gate electrode, and the data lines;
    a semiconductor member disposed on the gate insulating layer;
    an etch stopper layer disposed on the semiconductor member and the gate insulating layer;
    a first passivation layer disposed on the etch stopper layer;
    a source electrode disposed directly on top of the first passivation layer and the etch stopper layer, the source electrode electrically connected to the data lines;
    a drain electrode disposed directly on top of the etch stopper layer and electrically separated from the source electrode;
    a common electrode disposed directly on the first passivation layer and electrically separated from the source electrode and the drain electrode;
    a second passivation layer disposed directly on the source electrode, the drain electrode and the common electrode; and
    a pixel electrode disposed on the second passivation layer and electrically connected to the drain electrode.

2. The display device of claim 1, wherein the first passivation layer comprises an organic material.

3. The display device of claim 1, wherein the semiconductor member comprises a metal oxide.

* * * * *